(12) United States Patent
Raring et al.

(10) Patent No.: US 8,728,842 B2
(45) Date of Patent: May 20, 2014

(54) SELF-ALIGNED MULTI-DIELECTRIC-LAYER LIFT OFF PROCESS FOR LASER DIODE STRIPES

(75) Inventors: James W. Raring, Goleta, CA (US); Daniel F. Feezell, Goleta, CA (US); Nick Pfister, Goleta, CA (US)

(73) Assignee: Soraa Laser Diode, Inc., Goleta, CA (US)

( * ) Notice: Subject to any disclaimer, the term of this patent is extended or adjusted under 35 U.S.C. 154(b) by 0 days.

(21) Appl. No.: 13/425,354

(22) Filed: Mar. 20, 2012

(65) Prior Publication Data

US 2012/0178198 A1     Jul. 12, 2012

Related U.S. Application Data

(63) Continuation of application No. 12/502,382, filed on Jul. 14, 2009, now Pat. No. 8,143,148.

(60) Provisional application No. 61/080,654, filed on Jul. 14, 2008.

(51) Int. Cl.
*H01L 33/32* (2010.01)

(52) U.S. Cl.
USPC .......................................................... 438/46

(58) Field of Classification Search
CPC ... H01L 33/32; H01S 5/34333; H01S 5/2086; H01S 2301/176; H01S 2304/04; Y10S 438/981; Y10S 438/951
See application file for complete search history.

(56) References Cited

U.S. PATENT DOCUMENTS

| | | | |
|---|---|---|---|
| 4,065,688 A | 12/1977 | Thornton | |
| 4,341,592 A | 7/1982 | Shortes et al. | |
| 4,860,687 A | 8/1989 | Frijlink | |
| 4,911,102 A | 3/1990 | Manabe et al. | |
| 5,331,654 A | 7/1994 | Jewell et al. | |
| 5,334,277 A | 8/1994 | Nakamura | |

(Continued)

FOREIGN PATENT DOCUMENTS

| | | |
|---|---|---|
| CN | 101009347 | 3/1987 |
| CN | 1538534 | 10/2004 |

(Continued)

OTHER PUBLICATIONS

Abare, 'Cleaved and Etched Facet Nitride Laser Diodes,' IEEE Journal of Selected Topics in Quantum Electronics, vol. 4, No. 3, 1998, pp. 505-509.

(Continued)

*Primary Examiner* — Walter H Swanson
(74) *Attorney, Agent, or Firm* — Kilpatrick Townsend & Stockton LLP

(57) ABSTRACT

A method for forming a laser diode structure. The method includes providing a laser diode material having a surface region. A multilayer dielectric mask structure comprising alternating first and second dielectric layers is formed overlying the surface region. The method forms a laser diode structure using the multilayer dielectric mask structure as a mask. The method selectively removes a portion of the first dielectric layer to form one or more undercut regions between the second dielectric layers. A passivation layer overlies the multilayer dielectric mask structure and the undercut region remained intact. The dielectric mask structure is selectively removed, exposing a top surface region of the laser diode structure. A contact structure is formed overlying at least the exposed top surface region.

16 Claims, 13 Drawing Sheets

(56) References Cited

U.S. PATENT DOCUMENTS

| | | |
|---|---|---|
| 5,527,417 A | 6/1996 | Iida et al. |
| 5,607,899 A | 3/1997 | Yoshida et al. |
| 5,632,812 A | 5/1997 | Hirabayashi |
| 5,647,945 A | 7/1997 | Matsuse et al. |
| 5,821,555 A | 10/1998 | Saito et al. |
| 5,888,907 A | 3/1999 | Tomoyasu et al. |
| 5,951,923 A | 9/1999 | Horie et al. |
| 6,069,394 A | 5/2000 | Hashimoto et al. |
| 6,153,010 A | 11/2000 | Kiyoku et al. |
| 6,379,985 B1 | 4/2002 | Cervantes et al. |
| 6,451,157 B1 | 9/2002 | Hubacek |
| 6,635,904 B2 | 10/2003 | Goetz et al. |
| 6,680,959 B2 | 1/2004 | Tanabe et al. |
| 6,734,461 B1 | 5/2004 | Shiomi et al. |
| 6,755,932 B2 | 6/2004 | Masuda et al. |
| 6,809,781 B2 | 10/2004 | Setlur et al. |
| 6,814,811 B2 | 11/2004 | Ose |
| 6,833,564 B2 | 12/2004 | Shen et al. |
| 6,858,081 B2 | 2/2005 | Biwa et al. |
| 6,920,166 B2 | 7/2005 | Akasaka et al. |
| 7,009,199 B2 | 3/2006 | Hall |
| 7,033,858 B2 | 4/2006 | Chai et al. |
| 7,053,413 B2 | 5/2006 | D'Evelyn et al. |
| 7,128,849 B2 | 10/2006 | Setlur et al. |
| 7,303,630 B2 | 12/2007 | Motoki et al. |
| 7,312,156 B2 | 12/2007 | Granneman et al. |
| 7,358,542 B2 | 4/2008 | Radkov et al. |
| 7,358,543 B2 | 4/2008 | Chua et al. |
| 7,390,359 B2 | 6/2008 | Miyanaga et al. |
| 7,483,466 B2 | 1/2009 | Uchida et al. |
| 7,489,441 B2 | 2/2009 | Scheible et al. |
| 7,491,984 B2 * | 2/2009 | Koike et al. ............. 257/190 |
| 7,550,305 B2 | 6/2009 | Yamagata et al. |
| 7,555,025 B2 | 6/2009 | Yoshida |
| 7,598,104 B2 * | 10/2009 | Teng et al. ............. 438/40 |
| 7,691,658 B2 | 4/2010 | Kaeding et al. |
| 7,709,284 B2 | 5/2010 | Iza et al. |
| 7,727,332 B2 | 6/2010 | Habel et al. |
| 7,733,571 B1 | 6/2010 | Li |
| 7,749,326 B2 | 7/2010 | Kim et al. |
| 7,806,078 B2 | 10/2010 | Yoshida |
| 7,858,408 B2 | 12/2010 | Mueller et al. |
| 7,862,761 B2 | 1/2011 | Okushima et al. |
| 7,897,988 B2 | 3/2011 | Chen et al. |
| 7,923,741 B1 | 4/2011 | Zhai et al. |
| 7,939,354 B2 | 5/2011 | Kyono et al. |
| 7,968,864 B2 | 6/2011 | Akita et al. |
| 8,044,412 B2 | 10/2011 | Murphy et al. |
| 8,124,996 B2 | 2/2012 | Raring et al. |
| 8,126,024 B1 | 2/2012 | Raring |
| 8,148,180 B2 | 4/2012 | Felker et al. |
| 8,153,475 B1 | 4/2012 | Shum et al. |
| 8,242,522 B1 | 8/2012 | Raring |
| 8,247,887 B1 | 8/2012 | Raring et al. |
| 8,254,425 B1 | 8/2012 | Raring |
| 8,259,769 B1 | 9/2012 | Raring et al. |
| 8,294,179 B1 | 10/2012 | Raring |
| 8,313,964 B2 | 11/2012 | Sharma et al. |
| 8,314,429 B1 | 11/2012 | Raring et al. |
| 2001/0043042 A1 | 11/2001 | Murazaki et al. |
| 2002/0085603 A1 | 7/2002 | Okumura |
| 2002/0171092 A1 | 11/2002 | Goetz et al. |
| 2003/0000453 A1 | 1/2003 | Unno et al. |
| 2003/0001238 A1 | 1/2003 | Ban |
| 2003/0012243 A1 | 1/2003 | Okumura |
| 2003/0020087 A1 | 1/2003 | Goto et al. |
| 2003/0047076 A1 | 3/2003 | Liu |
| 2003/0140846 A1 | 7/2003 | Biwa et al. |
| 2003/0178617 A1 * | 9/2003 | Appenzeller et al. ............. 257/20 |
| 2003/0200931 A1 | 10/2003 | Goodwin |
| 2003/0216011 A1 | 11/2003 | Nakamura et al. |
| 2004/0025787 A1 | 2/2004 | Selbrede et al. |
| 2004/0060518 A1 | 4/2004 | Nakamura et al. |
| 2004/0080256 A1 | 4/2004 | Hampden-Smith et al. |
| 2004/0099213 A1 | 5/2004 | Adomaitis et al. |
| 2004/0146264 A1 | 7/2004 | Auner et al. |
| 2004/0151222 A1 | 8/2004 | Sekine |
| 2004/0233950 A1 | 11/2004 | Furukawa et al. |
| 2004/0247275 A1 | 12/2004 | Vakhshoori et al. |
| 2005/0040384 A1 | 2/2005 | Tanaka et al. |
| 2005/0072986 A1 | 4/2005 | Sasaoka |
| 2005/0168564 A1 | 8/2005 | Kawaguchi et al. |
| 2005/0214992 A1 | 9/2005 | Chakraborty et al. |
| 2005/0229855 A1 | 10/2005 | Raaijmakers |
| 2005/0247260 A1 | 11/2005 | Shin et al. |
| 2005/0285128 A1 | 12/2005 | Scherer et al. |
| 2006/0033009 A1 | 2/2006 | Kobayashi et al. |
| 2006/0060131 A1 | 3/2006 | Atanackovic |
| 2006/0078022 A1 | 4/2006 | Kozaki et al. |
| 2006/0086319 A1 | 4/2006 | Kasai et al. |
| 2006/0126688 A1 | 6/2006 | Kneissl |
| 2006/0144334 A1 | 7/2006 | Yim et al. |
| 2006/0175624 A1 | 8/2006 | Sharma et al. |
| 2006/0193359 A1 | 8/2006 | Kuramoto |
| 2006/0216416 A1 | 9/2006 | Sumakeris et al. |
| 2006/0240585 A1 | 10/2006 | Epler et al. |
| 2007/0045200 A1 | 3/2007 | Moon et al. |
| 2007/0081857 A1 | 4/2007 | Yoon |
| 2007/0086916 A1 | 4/2007 | LeBoeuf et al. |
| 2007/0093073 A1 | 4/2007 | Farrell, Jr. et al. |
| 2007/0101932 A1 | 5/2007 | Schowalter et al. |
| 2007/0110112 A1 | 5/2007 | Sugiura |
| 2007/0120141 A1 | 5/2007 | Moustakas et al. |
| 2007/0153866 A1 | 7/2007 | Shchegrov et al. |
| 2007/0163490 A1 | 7/2007 | Habel et al. |
| 2007/0184637 A1 | 8/2007 | Haskell et al. |
| 2007/0217462 A1 | 9/2007 | Yamasaki |
| 2007/0242716 A1 | 10/2007 | Samal et al. |
| 2007/0259464 A1 | 11/2007 | Bour et al. |
| 2007/0272933 A1 | 11/2007 | Kim et al. |
| 2007/0280320 A1 | 12/2007 | Feezell et al. |
| 2008/0092812 A1 | 4/2008 | McDiarmid et al. |
| 2008/0095492 A1 | 4/2008 | Son et al. |
| 2008/0124817 A1 | 5/2008 | Bour et al. |
| 2008/0149949 A1 | 6/2008 | Nakamura et al. |
| 2008/0149959 A1 | 6/2008 | Nakamura et al. |
| 2008/0164578 A1 | 7/2008 | Tanikella et al. |
| 2008/0173735 A1 | 7/2008 | Mitrovic et al. |
| 2008/0191223 A1 | 8/2008 | Nakamura et al. |
| 2008/0198881 A1 | 8/2008 | Farrell et al. |
| 2008/0217745 A1 | 9/2008 | Miyanaga et al. |
| 2008/0232416 A1 | 9/2008 | Okamoto et al. |
| 2008/0251020 A1 | 10/2008 | Franken et al. |
| 2008/0285609 A1 | 11/2008 | Ohta et al. |
| 2008/0291961 A1 | 11/2008 | Kamikawa et al. |
| 2008/0308815 A1 | 12/2008 | Kasai et al. |
| 2008/0315179 A1 | 12/2008 | Kim et al. |
| 2009/0021723 A1 | 1/2009 | De Lega |
| 2009/0058532 A1 | 3/2009 | Kikkawa et al. |
| 2009/0066241 A1 | 3/2009 | Yokoyama |
| 2009/0078944 A1 | 3/2009 | Kubota et al. |
| 2009/0080857 A1 | 3/2009 | St. John-Larkin |
| 2009/0086475 A1 | 4/2009 | Caruso et al. |
| 2009/0141765 A1 | 6/2009 | Kohda et al. |
| 2009/0153752 A1 | 6/2009 | Silverstein |
| 2009/0159869 A1 | 6/2009 | Ponce et al. |
| 2009/0229519 A1 | 9/2009 | Saitoh |
| 2009/0250686 A1 | 10/2009 | Sato et al. |
| 2009/0267100 A1 | 10/2009 | Miyake et al. |
| 2009/0273005 A1 | 11/2009 | Lin |
| 2009/0309110 A1 | 12/2009 | Raring et al. |
| 2009/0309127 A1 | 12/2009 | Raring et al. |
| 2009/0315965 A1 | 12/2009 | Yamagata et al. |
| 2009/0316116 A1 | 12/2009 | Melville et al. |
| 2009/0321778 A1 | 12/2009 | Chen et al. |
| 2010/0001300 A1 | 1/2010 | Raring et al. |
| 2010/0006546 A1 | 1/2010 | Young et al. |
| 2010/0006873 A1 | 1/2010 | Raring et al. |
| 2010/0044718 A1 | 2/2010 | Hanser et al. |
| 2010/0096615 A1 | 4/2010 | Okamoto et al. |
| 2010/0104495 A1 | 4/2010 | Kawabata et al. |
| 2010/0140745 A1 | 6/2010 | Khan et al. |
| 2010/0195687 A1 | 8/2010 | Okamoto et al. |
| 2010/0220262 A1 | 9/2010 | DeMille et al. |

(56) References Cited

U.S. PATENT DOCUMENTS

| | | |
|---|---|---|
| 2010/0295054 A1 | 11/2010 | Okamoto et al. |
| 2010/0302464 A1 | 12/2010 | Raring et al. |
| 2010/0309943 A1 | 12/2010 | Chakraborty et al. |
| 2010/0316075 A1 | 12/2010 | Raring et al. |
| 2010/0327291 A1 | 12/2010 | Preble et al. |
| 2011/0056429 A1 | 3/2011 | Raring et al. |
| 2011/0057167 A1 | 3/2011 | Ueno et al. |
| 2011/0064100 A1 | 3/2011 | Raring et al. |
| 2011/0064101 A1 | 3/2011 | Raring et al. |
| 2011/0064102 A1 | 3/2011 | Raring et al. |
| 2011/0075694 A1 | 3/2011 | Yoshizumi et al. |
| 2011/0103418 A1 | 5/2011 | Hardy et al. |
| 2011/0129669 A1 | 6/2011 | Fujito et al. |
| 2011/0164637 A1 | 7/2011 | Yoshizumi et al. |
| 2011/0180781 A1 | 7/2011 | Raring et al. |
| 2011/0182056 A1 | 7/2011 | Trottier et al. |
| 2011/0216795 A1 | 9/2011 | Hsu et al. |
| 2011/0247556 A1 | 10/2011 | Raring et al. |
| 2011/0281422 A1* | 11/2011 | Wang et al. .................. 438/478 |
| 2011/0286484 A1 | 11/2011 | Raring et al. |
| 2012/0104359 A1 | 5/2012 | Felker et al. |
| 2012/0135553 A1 | 5/2012 | Felker et al. |
| 2012/0187371 A1 | 7/2012 | Raring et al. |
| 2012/0314398 A1 | 12/2012 | Raring et al. |

FOREIGN PATENT DOCUMENTS

| | | |
|---|---|---|
| CN | 1702836 | 11/2005 |
| CN | 101079463 | 11/2007 |
| CN | 101099245 | 1/2008 |
| CN | 101171692 | 4/2008 |
| JP | 3-287770 | 12/1991 |
| JP | 2007173467 | 7/2007 |
| WO | 2008/041521 | 4/2008 |

OTHER PUBLICATIONS

Chinese Office Action From Chinese Patent Application No. 200980134723.8 dated Nov. 1, 2012, 22 pgs. (With Translation).

Founta et al., 'Anisotropic Morphology of Nonpolar a-Plane GaN Quantum Dots and Quantum Wells,' Journal of Applied Physics, vol. 102, vol. 7, 2007, pp. 074304-1-074304-6.

Franssila, 'Tools for CVD and Epitaxy', Introduction to Microfabrication, 2004, pp. 329-336.

Khan, 'Cleaved Cavity Optically Pumped InGaN—GaN Laser Grown on Spinel Substrates,' Applied Physics Letters, vol. 69, No. 16, 1996, pp. 2417-2420.

Lin et al., 'Influence of Separate Confinement Heterostructure Layer on Carrier Distribution in InGaAsP Laser Diodes With Nonidentical Multiple Quantum Wells,' Japanese Journal of Applied Physics, vol. 43, No. 10, 2004, pp. 7032-7035.

Okamoto et al., 'Continuous-Wave Operation of m-Plane InGaN Multiple Quantum Well Laser Diodes,' Japanese Journal of Applied Physics, vol. 46, No. 9, 2007, pp. L187-L189.

Okamoto et al., 'High-Efficiency Continuous-Wave Operation of Blue-Green Laser Diodes Based on Nonpolar mPlane Gallium Nitride,' The Japan Society of Applied Physics, Applied Physics, Express 1, 2008, pp. 072201-1-072201-3.

Park, 'Crystal Orientation Effects on Electronic Properties of Wurtzite InGaN/GaN Quantum Wells,', Journal of Applied Physics, vol. 91, No. 12, 2002, pp. 9903-9908.

Romanov et al., 'Strain-Induced Polarization in Wurtzite III-Nitride Semipolar Layers,' Journal of Applied Plysics, vol. 100, 2006, pp. 023522-1 through 023522-10.

Schoedl, 'Facet Degradation of GaN Heterostructure Laser Diodes,' Journal of Applied Physics, vol. 97, issue 12, 2006, pp. 123102-1-123102-8.

Zhong et al., 'Demonstration of High Power Blue-Green Light Emitting Diode on Semipolar (1122) Bulk GaN Substrate,' Electronics Letters, vol. 43, No. 15, 2007, pp. 825-826.

USPTO Office Action for U.S. Appl. No. 12/481,543 dated Jun. 27, 2011.
USPTO Office Action for U.S. Appl. No. 12/482,440 dated Feb. 23, 2011.
USPTO Office Action for U.S. Appl. No. 12/482,440 dated Aug. 12, 2011.
USPTO Office Action for U.S. Appl. No. 12/484,924 dated Apr. 14, 2011.
USPTO Office Action for U.S. Appl. No. 12/484,924 dated Oct. 31, 2011.
USPTO Office Action for U.S. Appl. No. 12/491,169 dated Oct. 22, 2010.
USPTO Office Action for U.S. Appl. No. 12/491,169 dated May 11, 2011.
USPTO Office Action for U.S. Appl. No. 12/497,289 dated Feb. 2, 2012.
USPTO Notice of Allowance for U.S. Appl. No. 12/497,289 dated May 22, 2012.
USPTO Office Action for U.S. Appl. No. 12/502,058 dated Dec. 8, 2010.
USPTO Office Action for U.S. Appl. No. 12/502,058 dated Aug. 19, 2011.
USPTO Notice of Allowance for U.S. Appl. No. 12/502,058 dated Apr. 16, 2012.
USPTO Notice of Allowance for U.S. Appl. No. 12/502,058 dated Jul. 19, 2012.
USPTO Office Action for U.S. Appl. No. 12/534,829 dated Apr. 19, 2011.
USPTO Notice of Allowance for U.S. Appl. No. 12/534,829 dated Oct. 28, 2011.
USPTO Notice of Allowance for U.S. Appl. No. 12/534,829 dated Dec. 5, 2011.
USPTO Notice of Allowance for U.S. Appl. No. 12/534,829 dated Dec. 21, 2011.
USPTO Office Action for U.S. Appl. No. 12/573,820 dated Mar. 2, 2011.
USPTO Office Action for U.S. Appl. No. 12/573,820 dated Oct. 11, 2011.
USPTO Office Action for U.S. Appl. No. 12/749,466 dated Jun. 29, 2011.
USPTO Office Action for U.S. Appl. No. 12/749,466 dated Feb. 3, 2012.
USPTO Office Action for U.S. Appl. No. 12/749,466 dated Jul. 3, 2012.
USPTO Office Action for U.S. Appl. No. 12/759,273 dated Nov. 21, 2011.
USPTO Office Action for U.S. Appl. No. 12/759,273 dated Jun. 26, 2012.
USPTO Office Action for U.S. Appl. No. 12/762,269 dated Oct. 12, 2011.
USPTO Notice of Allowance for U.S. Appl. No. 12/762,269 dated Apr. 23, 2012.
USPTO Office Action for U.S. Appl. No. 12/762,271 dated Dec. 23, 2011.
USPTO Office Action for U.S. Appl. No. 12/762,271 dated Jun. 6, 2012.
USPTO Notice of Allowance for U.S. Appl. No. 12/762,271 dated Aug. 8, 2012.
USPTO Notice of Allowance for US Application No. 12/762,278 dated Nov. 7, 2011.
USPTO Office Action for U.S. Appl. No. 12/778,718 dated Nov. 25, 2011.
USPTO Notice of Allowance for U.S. Appl. No. 12/778,718 dated Apr. 3, 2012.
USPTO Notice of Allowance for U.S. Appl. No. 12/778,718 dated Jun. 13, 2012.
USPTO Office Action for U.S. Appl. No. 12/789,303 dated Sep. 24, 2012.
USPTO Office Action for U.S. Appl. No. 12/858,379 dated Apr. 14, 2011.
USPTO Notice of Allowance for U.S. Appl. No. 12/858,379 dated Dec. 6, 2011.

(56) References Cited

OTHER PUBLICATIONS

USPTO Office Action for U.S. Appl. No. 12/859,153 dated Sep. 25, 2012.
USPTO Office Action for U.S. Appl. No. 12/868,441 dated Apr. 30, 2012.
USPTO Office Action for U.S. Appl. No. 12/880,803 dated Feb. 22, 2012.
USPTO Notice of Allowance for U.S. Appl. No. 12/880,803 dated Jul. 18, 2012.
USPTO Office Action for U.S. Appl. No. 12/883,093 dated Mar. 13, 2012.
USPTO Office Action for U.S. Appl. No. 12/883,093 dated Aug. 3, 2012.
USPTO Notice of Allowance for U.S. Appl. No. 12/883,093 dated Nov. 21, 2012.
USPTO Office Action for U.S. Appl. No. 12/883,652 dated Apr. 17, 2012.
USPTO Office Action for U.S. Appl. No. 12/884,993 dated Mar. 16, 2012.
USPTO Office Action for U.S. Appl. No. 12/884,993 dated Aug. 2, 2012.
USPTO Notice of Allowance for U.S. Appl. No. 12/884,993 dated Nov. 26, 2012.
USPTO Office Action for U.S. Appl. No. 12/995,946 dated Mar. 28, 2012.
USPTO Office Action for U.S. Appl. No. 13/014,622 dated Nov. 28, 2011.
USPTO Office Action for U.S. Appl. No. 13/014,622 dated Apr. 30, 2012.
USPTO Office Action for U.S. Appl. No. 13/046,565 dated Nov. 7, 2011.
USPTO Office Action for U.S. Appl. No. 13/046,565 dated Feb. 2, 2012.
USPTO Office Action for U.S. Appl. No. 13/046,565 dated Apr. 13, 2012.
USPTO Office Action for U.S. Appl. No. 13/046,565 dated Jul. 19, 2012.
USPTO Notice of Allowance for U.S. Appl. No. 13/163,498 dated Jul. 23, 2012.
USPTO Notice of Allowance for U.S. Appl. No. 13/184,160 dated Dec. 12, 2011.
USPTO Office Action for U.S. Appl. No. 13/354,639 dated Nov. 7, 2012.
USPTO Notice of Allowance for U.S. Appl. No. 13/354,639 dated Dec. 14, 2012.
USPTO Notice of Allowance for U.S. Appl. No. 13/419,325 dated Dec. 4, 2012.
USPTO Office Action for U.S. Appl. No. 13/465,976 dated Aug. 16, 2012.

\* cited by examiner

SELF-ALIGNED MULTI-DIELECTRIC-LAYER LIFT OFF PROCESS FOR LASER DIODE STRIPES

CROSS-REFERENCE TO RELATED APPLICATIONS

This application is a continuation of U.S. application Ser. No. 12/502,382, filed Jul. 14, 2009; which application claims priority to U.S. Provisional Application No. 61/080,654, filed Jul. 14, 2008, which are incorporated herein by reference for all purposes.

BACKGROUND OF THE INVENTION

The present invention is directed to optical devices and related methods. More particularly, the present invention provides a method and device for emitting electromagnetic radiation for optical devices using non-polar or semipolar gallium containing substrates such as GaN, AN, InN, InGaN, AlGaN, and AlInGaN, and others. Merely by way of example, the invention can be applied to optical devices, lasers, light emitting diodes, solar cells, photoelectrochemical water splitting and hydrogen generation, photodetectors, integrated circuits, and transistors, among other devices.

In the late 1800's, Thomas Edison invented the lightbulb. The conventional lightbulb, commonly called the "Edison bulb," has been used for over one hundred years. The conventional light bulb uses a tungsten filament enclosed in a glass bulb sealed in a base, which is screwed into a socket. The socket is coupled to an AC power source or a DC power source. The conventional light bulb can be found commonly in houses, buildings, and outdoor lighting applications, and other areas requiring light. Unfortunately, drawbacks exist with the conventional Edison light bulb. That is, the conventional light bulb dissipates much thermal energy leading to inefficiencies. More than 90% of the energy used for the conventional light bulb dissipates as thermal energy. Additionally, the conventional light bulb routinely fails often due to thermal expansion and contraction of the filament element.

To overcome some of the drawbacks of the conventional light bulb, fluorescent lighting has been developed. Fluorescent lighting uses an optically clear tube structure filled with a halogen gas. A pair of electrodes is coupled between the halogen gas and couples to an alternating power source through a ballast. Once the gas has been excited, it discharges to emit light. Often times, the optically clear tube is coated with phosphor materials. Many building structures use fluorescent lighting and, more recently, fluorescent lighting has been fitted onto a base structure, which couples into a standard socket.

Solid state lighting techniques have also been used. Solid state lighting relies upon semiconductor materials to produce light emitting diodes, commonly called LEDs. At first, red LEDs were demonstrated and introduced into commerce. Red LEDs use Aluminum Indium Gallium Phosphide (or AlInGaP) semiconductor materials. Most recently, Shuji Nakamura pioneered the use of InGaN materials to produce LEDs emitting light in the blue color range for blue LEDs. The blue colored LEDs lead to innovations such as the Blu-eRay™ DVD player, solid state white lighting, and other developments. Other colored LEDs have also been proposed.

High intensity green LEDs based on GaN have been proposed and even demonstrated with limited success. Unfortunately, achieving high intensity, high-efficiency GaN-based green LEDs has been problematic. The performance of optoelectronic devices fabricated on conventional c-plane GaN suffer from strong internal polarization fields, which leads to poor radiative recombination efficiency. Since this phenomenon becomes more pronounced in InGaN layers with increased indium content for increased wavelength emission, extending the performance of GaN-based LEDs to the green regime has been difficult. Furthermore, increased indium content in a GaN film often requires reduced growth temperature leading to poorer crystal quality of high-indium-content InGaN films. The difficulty of achieving a high intensity green LED has lead scientists and engineers to the term "green gap" to describe the generally unavailability of such green LED. These and other limitations may be described throughout the present specification and more particularly below.

From the above, it is seen that techniques for improving optical devices is highly desired.

SUMMARY OF THE INVENTION

The present invention is directed to optical devices and related methods. More particularly, the present invention provides a method and device for emitting electromagnetic radiation for optical devices using non-polar or semipolar gallium containing substrates such as GaN, AN, InN, InGaN, AlGaN, and AlInGaN, and others. Merely by way of example, the invention can be applied to optical devices, lasers, light emitting diodes, solar cells, photoelectrochemical water splitting and hydrogen generation, photodetectors, integrated circuits, and transistors, among other devices In a specific embodiment, a method for forming a laser diode structure is provided. The method includes providing a laser diode material structure having a surface region. The laser diode material structure includes an underclad layer, an upper clad layer and an active layer sandwiched between the under clad layer and the upper clad layer. A multilayer dielectric stack is deposited overlying the surface region. In a specific embodiment, the multilayer dielectric stack includes an alternating layers of at least a first dielectric layer and a second dielectric layer. The method selectively removes a portion of the multilayer dielectric stack to form a dielectric mask structure using a pattern and etch process. A portion of the upper clad layer is removed using the dielectric mask structure as a mask to form a laser diode structure. In a specific embodiment, the laser diode structure has an exposed sidewall region and a top region. In a specific embodiment, a portion of each of the first dielectric layer is selectively removed to form an undercut region between the second dielectric layers. A passivation layer is formed conformingly overlying at least the exposed sidewall region, and the dielectric mask structure while maintaining the undercut region unfilled. The dielectric mask structure is removed to expose the top surface region of the laser diode structure using a selective etch process. In a specific embodiment, the undercut region allows the selective etch process to occur in a lateral direction. The method forms a contact structure overlying at least the top surface region.

In an alternative embodiment, a method of processing an optical device is provided. The method includes providing a gallium and nitrogen containing substrate material having a surface region. The method forms a multi-layered stack region overlying the surface region. The multi-layered stack region includes at least a first dielectric layer and an overlying second dielectric layer in a specific embodiment. The first dielectric layer overlies the surface region in a specific embodiment. The multi-layered stack region is patterned to form a patterned mask structure and a ridge region is formed using the patterned mask structure as mask. The method includes selectively removing one or more portions of the patterned mask structure in a specific embodiment.

Many benefits can be achieved by ways of the present invention. For example, the multilayer mask structure eliminates the use of a photoresist material to expose a top surface region. The top surface region allows for a contact structure to form for the optical device structure according to one or more embodiments. In addition, the multilayer mask structure also provides for a thick dielectric mask without incurring stress on the optical device structure according to one or more embodiments. Depending on the embodiment, one or more of these benefits can be achieved. Further detail of the method and the benefits can be found throughout the present specification and particularly below.

DETAILED DESCRIPTION OF THE INVENTION

Figure 1:
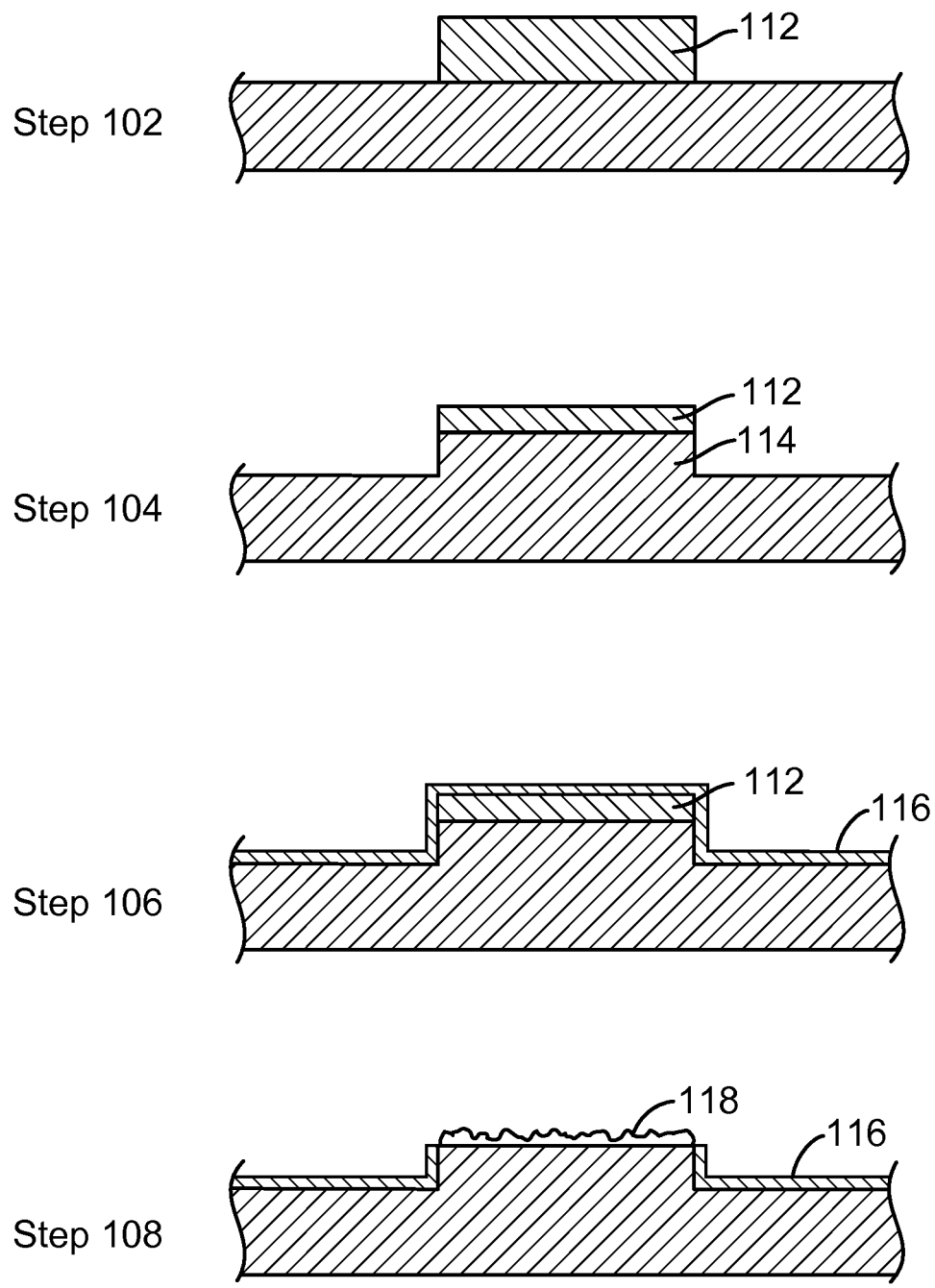
FIG. 1 is simplified diagram illustrating a conventional method of forming a laser diode stripe.

The present invention is directed to optical devices and related methods. More particularly, the present invention provides a method and device for emitting electromagnetic radiation for optical devices using non-polar or semipolar gallium containing substrates such as GaN, AN, InN, InGaN, AlGaN, and AlInGaN, and others. Merely by way of example, the invention can be applied to optical devices, lasers, light emitting diodes (e.g., red, green, blue), solar cells, photoelectrochemical water splitting and hydrogen generation, photodetectors, integrated circuits, and transistors, among other devices.

As used herein, the term gallium nitride substrate material is associated with Group III-nitride based materials including GaN, InGaN, AlGaN, or other Group III containing alloys or compositions that are used as starting materials. Such starting materials include polar GaN substrates (i.e., substrate where the largest area surface is nominally an (h k l) plane wherein h=k=0, and l is non-zero), non-polar GaN substrates (i.e., substrate material where the largest area surface is oriented at an angle ranging from about 80-100 degrees from the polar orientation described above towards an (h k l) plane wherein l=0, and at least one of h and k is non-zero) or semi-polar GaN substrates (i.e., substrate material where the largest area surface is oriented at an angle ranging from about +0.1 to 80 degrees or 110-179.9 degrees from the polar orientation described above towards an (h k l) plane wherein l=0, and at least one of h and k is non-zero). Of course, there can be other meanings understood by one of ordinary skill in the art, including modifications, alternatives, and variations.

This specification describes improved methods to fabricate laser stripes using a dielectric lift process according to one or more embodiments. A desired result of this process is to efficiently remove a blanket coated passivation layer such as $ZrO_2$, $Ta_2O_5$ or amorphous silicon from the laser diode ridge tops to expose a clean surface for metal contact. There are several benefits to our proposed technique relative to conventional self-aligned lift-off methods that rely on a single dielectric layer or photoresist to remove the passivation layer. Self-aligned photoresist-based processes begin with the patterning of the photoresist into the desired laser stripe geometry, followed by the etching of the laser stripe pattern into the semiconductor below using the resist as the etch mask. This is followed by a blanket deposition of one or more passivation layers and a lift-off step such that the resist lifts off the passivation layer(s) from the ridge top exposing the semiconductor only in this region. The benefit to this process is that undercut resist profiles can be easily achieved such that lift-off of the passivation layer(s) is trivial and does not require mechanical assistance such as an ultrasonic bath.

A drawback to this method is that the photoresist mask can lead to the formation of chemical resistant polymers during the semiconductor etch, which can create issues in subsequent processing steps and reduce device yield. To avoid this problem a thick (+1 µm) dielectric mask can be patterned using photoresist, after which the photoresist is removed such that only dielectric remains on the sample during the semiconductor etch step according to one or more embodiments. The dielectric material should be thick to withstand the semiconductor etch step and to facilitate lift-off of the passivation layer. After the semiconductor etch, the thick dielectric layer remains on the ridge tops during a blanket coating of the passivation layer. Next the sample is placed in an ultrasonic bath and submerged in an etch agent such as buffered hydrofluoric acid, commonly called "BHF." The ultrasonic action delaminates the thick dielectric mask layer from the ridge tops, lifting off the passivation layer on top of the dielectric mask layer, leaving exposed semiconductor material only on the tops of the ridges.

A drawback to this process is that it relies on mechanical removal of the dielectric mask layer, which is rather aggressive and can lead to microstructural issues in the semiconductor such as propagation of the micro-cracks. Furthermore, some of the thick dielectric layers used in this process often suffer from excessive strain leading to premature delamination such that the pattern fidelity is degraded during the patterning step or bare ridge tops are exposed during coating of the passivation layer.

In a specific embodiment, the present self-aligned process is shown in detail in the Figures that accompany the present specification. One or more of difference between the present process and the process that uses a thick dielectric layer is that our process uses a multi-layer dielectric stack according to one or more embodiments. By depositing alternating layers of two different dielectrics such as $Si_xN_y$ and $SiO_2$ (or other suitable materials) and then patterning the laser stripe geometry into this layer stack, we avoid using photoresist during the semiconductor etch step. Of course, there can be other combinations of different materials depending upon the specific embodiment. After this etch is complete, the sample is subjected to an acid dip that will preferentially etch one dielectric relative to the other. In our example, $SiO_2$ will etch 2-10 times faster than $Si_xN_y$ in buffered HF. This will result in undercutting of the $Si_xN_y$ layer according to a specific embodiment.

When the passivation layer such as $ZrO_2$, $Ta_2O_5$, or amorphous silicon is deposited using a directional deposition method such as electron-beam deposition or sputtering, the passivation layer will be discontinuous on the sides of the dielectric stack as shown according to a specific embodiment. These discontinuities will allow a liquid etchant to penetrate into the dielectric layers and remove both the dielectric and passivation layers from the ridge tops. In this process no aggressive mechanical assistance will be needed for lift-off. Furthermore, since alternating dielectric layers are used, strain compensation can be realized if the two alternating dielectric layers have opposite strain polarities such as $SiO_2$ and $Si_xN_y$, among other materials. This will allow for thick stacks to be deposited without the delamination issues that result from a single thick layer. Thus, our process solves the problem of photoresist presence during the semiconductor etch step, eliminates the need for aggressive mechanical assistance, and allows for thick dielectric layers to withstand the etch. These and other details of the present invention are described throughout the present specification and more particularly below.

One or more keys to the process according to a specific embodiment are outlined below:
1. The dielectric layers have the same or similar dry etch properties such that vertical sidewalls can be achieved according to one or more embodiments.
2. The dielectric layers have different wet etch rates to achieve the undercutting effect such as, for example, $Si_xN_y$ and $SiO_2$ etched in BHF according to one or more embodiments.
3. The dielectric layers preferentially etch relative to the passivation layer, which remains intact during the lift-off process according to one or more embodiments. For example, BHF will not attack high-quality $ZrO_2$, $Ta_2O_5$, or amorphous silicon, but will etch $Si_xN_y$ and $SiO_2$.

It is important to note that in the attachment showing an example of our proposed process, the dielectric layers are shown with approximately equal thickness and with one possibility for the order and number of layers according to a specific embodiment. There are several other dielectric stack configurations that could be advantageous. For example, a thicker uppermost layer may be desired to withstand the semiconductor etch step and undercut step, the number of undercut layers does not have to be two as in our example, and the bottom most layer does not necessarily have to be an undercut layer. Other embodiments of this invention include using a multilayer passivation layer scheme, such as a first layer contacting the semiconductor surface comprised of $SiO_2$ and a second layer such $ZrO_2$, $Ta_2O_5$, or amorphous silicon that will protect the first layer from the etchant solution during the lift-off process. There are many degrees of freedom in this process that will offer great flexibility. It is our goal to claim all possible dielectric stack sequences (or other types of stacked sequences) for the purpose of a self-aligned ridge process. Of course, there can be many variations, modifications, and alternatives.

FIG. 1 is a simplified diagram illustrating a conventional self-aligned lift-off method to form a laser diode stripe structure. The conventional method relies on a single dielectric layer or photoresist to remove the passivation layer. As shown, a self-aligned photoresist-based processes begin with the patterning of a photoresist 112 into the desired laser stripe geometry (Step 102), followed by the etching (Step 104) of the laser stripe pattern 114 into the semiconductor below using the resist as the etch mask. This is followed by a blanket deposition (Step 106) of a passivation layer 116 and a lift-off step (Step 108) such the resist lifts off the passivation layer from the ridge top exposing the semiconductor only in this region. A feature to this process is that undercut resist profiles can be easily achieved such that lift-off of the passivation layer is trivial and does not require mechanical assistance such as an ultrasonic bath. A drawback to this method is that the photoresist mask can lead to the formation of chemical resistant polymers 118 during the semiconductor etch. Such defects reduce device yield and affect device reliability.

A method for forming a laser diode stripe structure according to an embodiment of the present invention may be outlined as follow.
(1) Start
(2) Providing a laser diode structure including an under clad layer, an upper clad layer and an active layer sandwiched between the under clad layer and the upper clad layer;
(3) Depositing a multilayer dielectric stack comprising alternating layers of a first dielectric layer and a second dielectric layer overlying the laser diode structure;
(4) Selectively removing a portion of the multilayer dielectric stack to form a multilayer dielectric stack structure using a pattern and etch process;
(5) Removing a portion of the upper clad layer while maintaining the multilayer dielectric stack structure, exposing a surface region and forming an upper clad layer ridge structure, the upper clad layer ridge structure including an exposed side wall region and a top region;
(6) Selectively removing a portion of each of the first dielectric layer to form one or more undercut region between the second dielectric layers;
(7) Depositing one or more passivation layers overlying the surface region of the upper layer, the exposed sidewall region, and the multilayer dielectric stack structure, while the undercut regions remained substantially intact (in one or more embodiments, the layers are conformingly overlying the surface region);
(8) Removing the multilayer dielectric stack structure using a selective etch process, whereupon the undercut regions allow the selective etch process to occur in a lateral direction;
(9) Exposing the top surface region; and
(10) Forming a contact structure overlying at least the top surface region.

The above sequence of steps provides a self-align method for forming a laser diode structure including a electrode structure according to an embodiment of the present invention. Depending on the specific embodiment, one or more steps may be included, one or more steps may be omitted, or one or more steps may be performed in a different sequence without departing from the scope of the present invention. One skilled in the art would recognize other variations, modifications, and alternatives.

Figure 2:
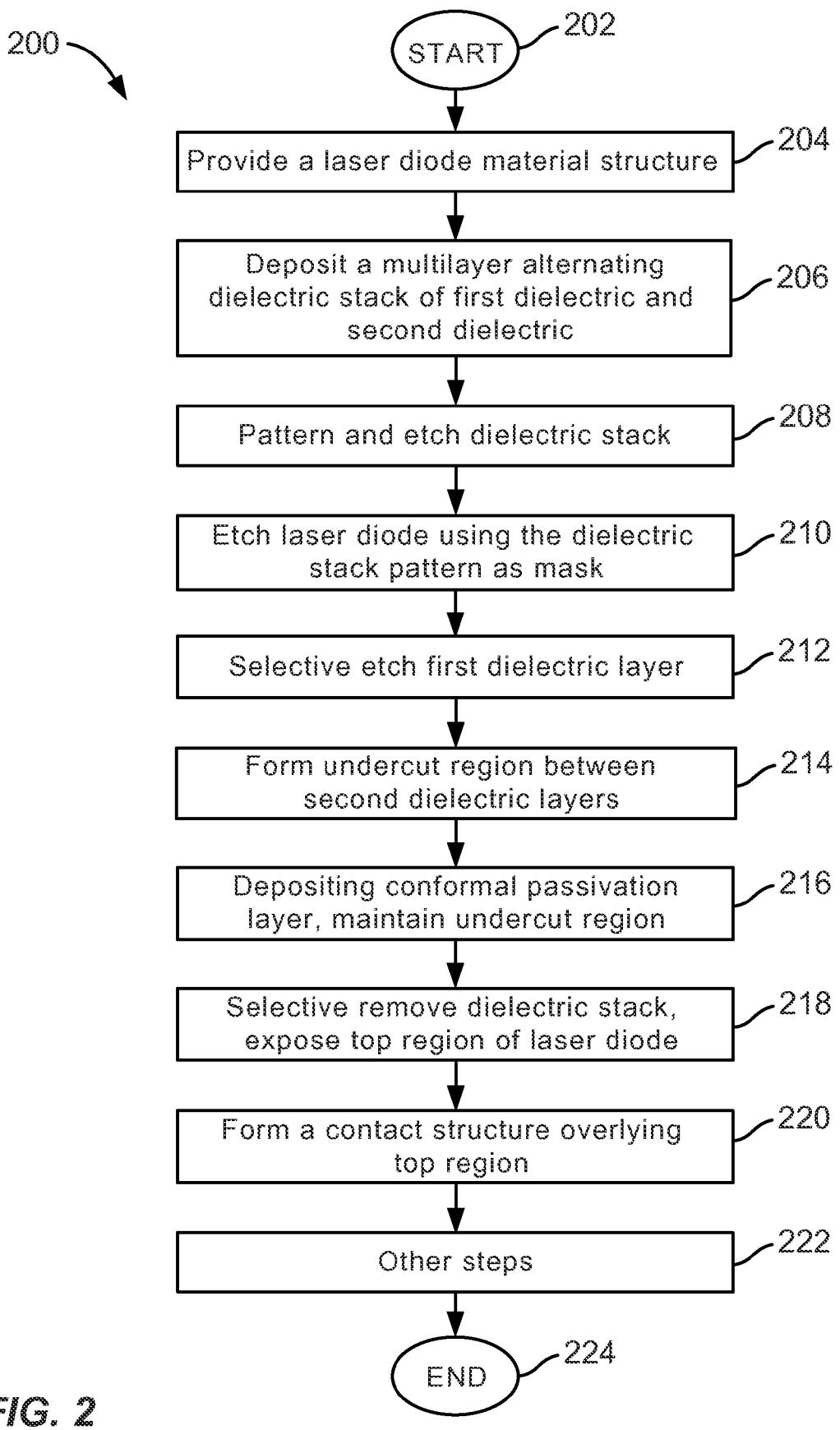
FIG. 2 is simplified process flow diagram illustrating a method of forming a laser diode stripe according to an embodiment of the present invention.

FIG. 2 is a simplified process flow diagram 200 illustrating a method of forming a laser diode stripe according to an embodiment of the present invention. This flow diagram is merely an example and should not unduly limit the claims herein. One skilled in the art would recognize other modifications, variations, and alternatives. As shown, the method begins with a Start step (Step 202). A laser diode material structure is provided (Step 204). In a specific embodiment, the laser diode material structures comprises one or more gallium nitride materials, but can be others. The method includes depositing a multilayer dielectric stack comprising at least one alternating first dielectric layer and second dielectric layer in a specific embodiment (Step 206). The dielectric stack is subjected to a patterned and etched process to provide for a dielectric mask structure (Step 208). Again, there can be other variations, modifications, and alternatives.

Referring again to FIG. 2. In a specific embodiment, the method includes forming a laser diode structure (Step 210) using the dielectric mask structure as a masking layer while maintaining the dielectric mask structure substantially intact in a specific embodiment. In a specific embodiment, the dielectric mask structure is configured to provide for a ridge structure for the laser diode structure. The laser diode structure can have other geometrical configurations depending on the application. In a specific embodiment, the dielectric mask structure is subjected to a selective etch process (Step 212) to remove a portion from each of the first dielectric layers to form an undercut region between adjacent second dielectric layers in a specific embodiment (Step 214). The method deposits a conformal passivation layer overlying at least the etched dielectric stack, exposed portion of the laser diode structure while maintaining the undercut regions substantially intact (Step 216). The conformal passivation layer can include $ZrO_2$, $Ta_2O_5$, or amorphous silicon and the like in a specific embodiment. In a specific embodiment, the method includes selectively removing the dielectric stack, exposing a top region of the laser diode structure (Step 218) in a specific embodiment. The method forms an electrode or contact structure overlying the top region of the laser diode structure (Step 220). The method ends with a stop step (Step 222), although there can be other variations, modifications, and alternatives.

The above sequence of steps provides a self-align method for forming a laser diode structure including an electrode structure according to an embodiment of the present invention. Depending on the specific embodiment, one or more steps may be included, one or more steps may be omitted, or one or more steps may be performed in a different sequence without departing from the scope of the present invention. One skilled in the art would recognize other variations, modifications, and alternatives.

Figure 3:
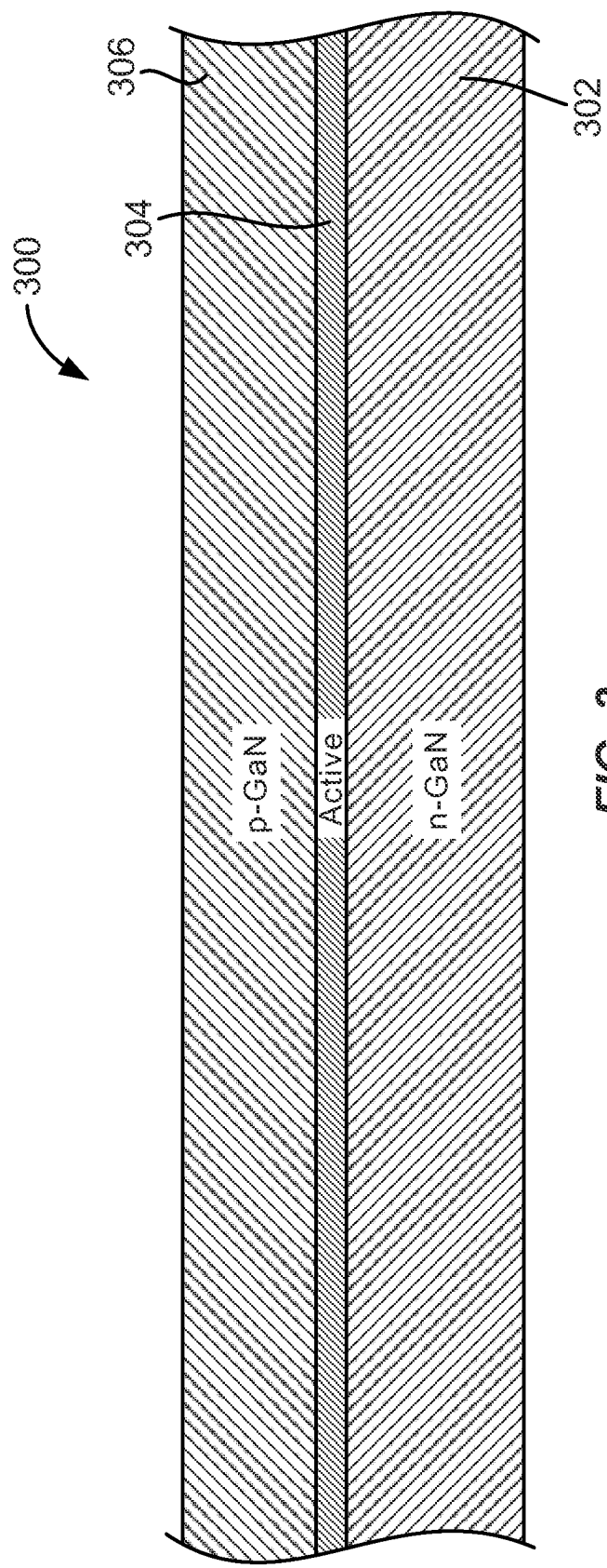
FIG. 3-13 are simplified diagram illustrating the method of forming a laser diode stripe according to an embodiment of the present invention.

FIGS. 3-13 are simplified diagrams illustrating a method of forming a laser diode structure according to an embodiment of the present invention. As shown in FIG. 3, a laser diode material structure 300 is provided. The laser diode material structure includes an underclad layer 302, an active layer 304 and an upper clad layer 306. The laser diode material may also have other configuration. In a specific embodiment, the underclad layer may be a gallium containing material such as gallium nitride or other suitable gallium containing material. In certain embodiment, the underclad layer can have an n-type characteristic. The active layer is usually a doped gallium nitride material, for example, InGaN, AlGaN but can also be others. In a specific embodiment, the active layer is epitaxially grown on a non-polar or semi-polar crystal plane of the underclad layer. The upper clad layer overlies the active layer, as shown. The upper clad layer can be a gallium nitride material in a specific embodiment. Depending on the application, the upper clad layer can having a p-type impurity characteristics. Of course there can be other variations, modifications, and alternatives.

Figure 4:
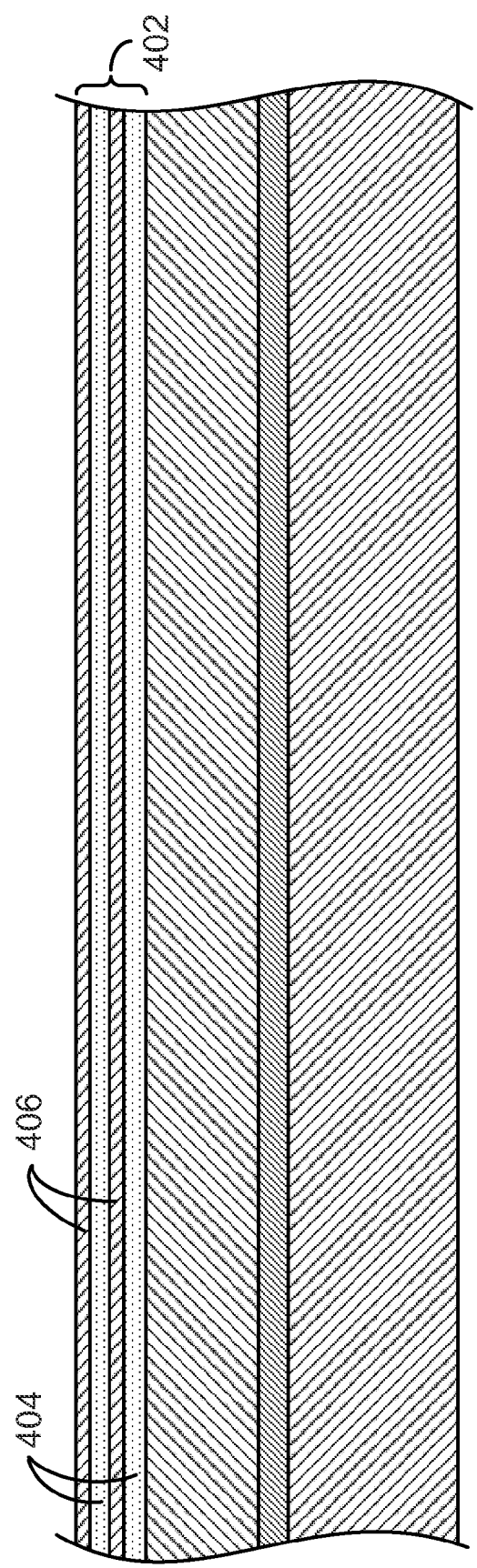
Figure 5:
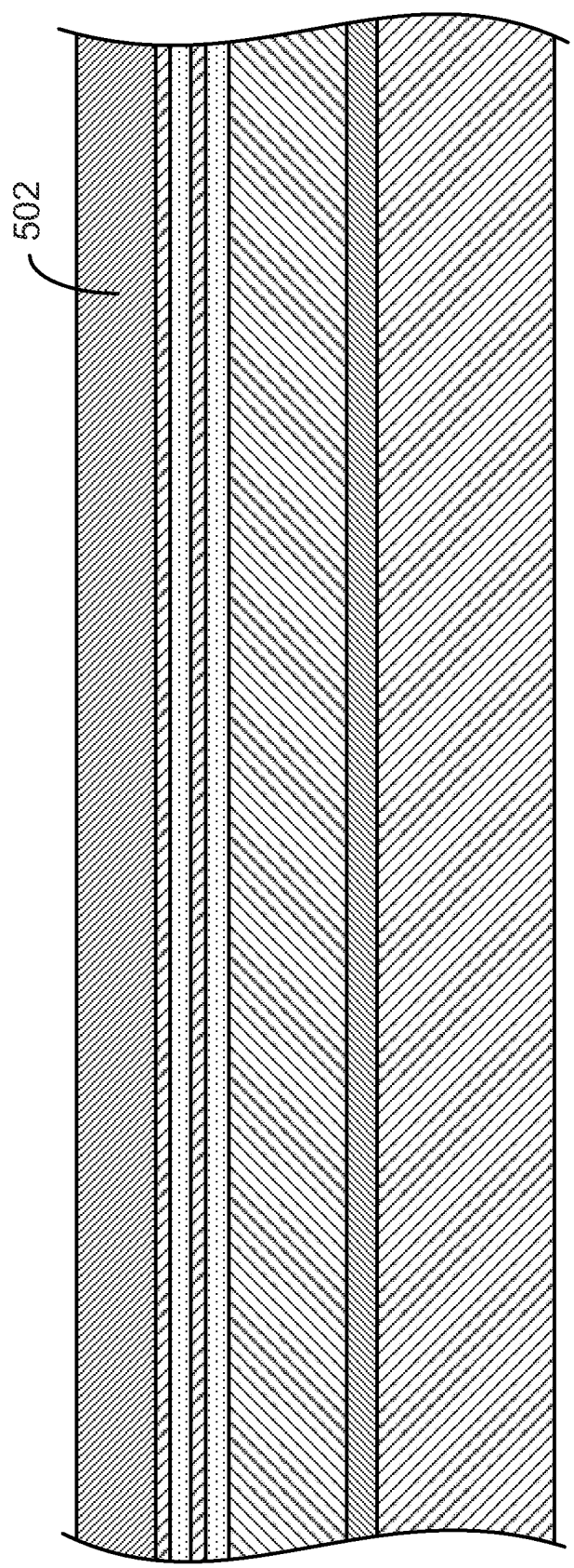

Referring to FIG. 4, the method includes depositing a dielectric stack 402 overlying the laser diode material structure. As shown, the dielectric stack includes alternating layers of a first dielectric material 404 and a second dielectric material 406. The first dielectric material and the second dielectric material are selected to have certain etch characteristics in a specific embodiment. In addition, the first dielectric layer and the second dielectric layer are selected to have an opposite strain polarities to prevent delamination from the laser diode material. In a specific embodiment, the first dielectric material can be silicon oxide and the second dielectric material can be silicon nitride. Other dielectric materials may also be used depending on the application. In a specific embodiment, the first dielectric layer can have a same thickness as the second dielectric layer. In an alternative embodiment, the first dielectric layer may have a different thickness as the second dielectric layer. In a preferred embodiment, a top most layer can be a thickness 410, which is greater than the other underlying dielectric layers. Such a configuration allows the dielectric stack to withstand a subsequent semiconductor material etch or other etch process.

Figure 6:
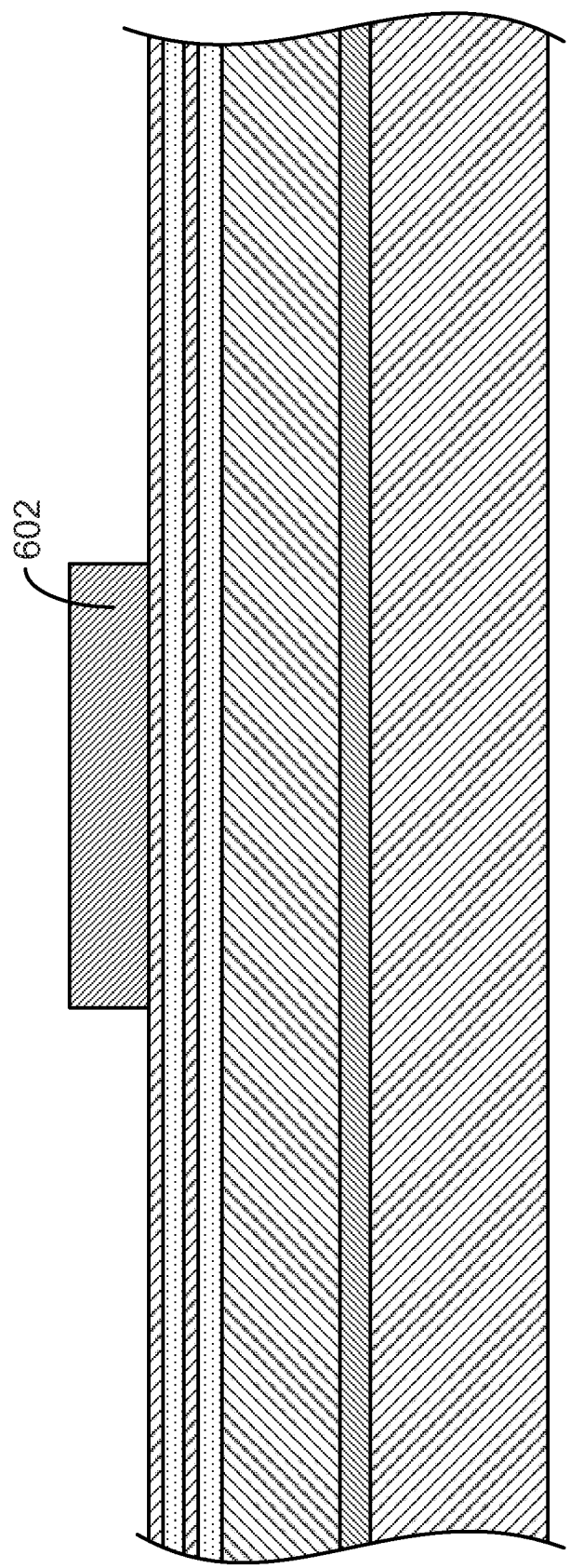
Figure 7:
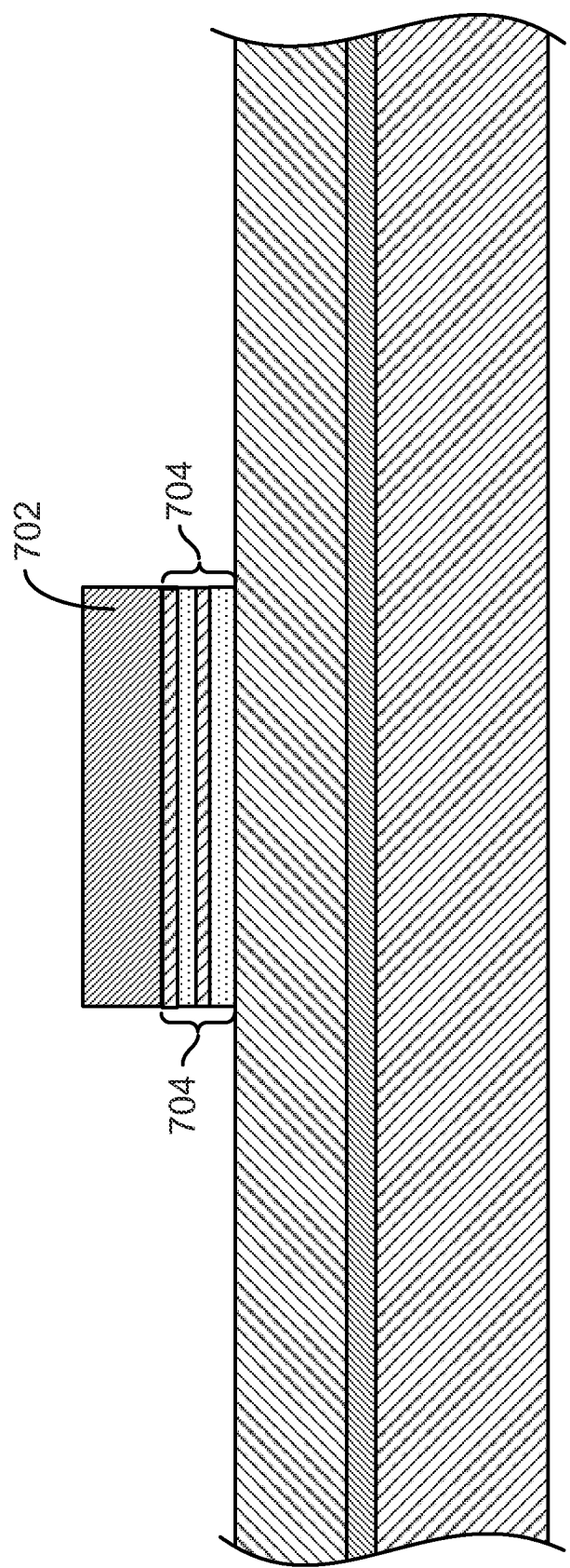
Figure 8:
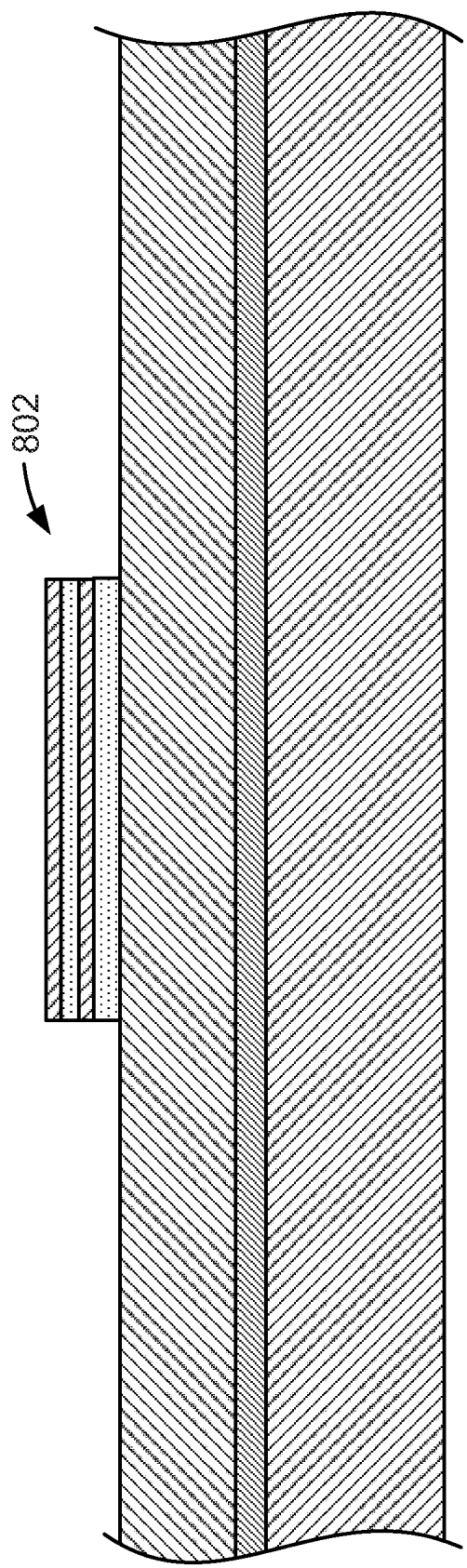

As shown in FIGS. 5-8, the dielectric stack is subjected to a pattern and etch process to form a dielectric mask structure. A photoresist 502 is deposited overlying the dielectric stack using for example, a spin on process. The photoresist layer is patterned to form a masking structure 602 as shown in FIG. 6. As shown in FIG. 7, the method includes a first etching process to form a photoresist masking structure 702. The first etching process can be a dry etch process using suitable fluorinated species in a plasma environment in a specific embodiment. In a specific embodiment, the first etching process has substantially the same etch selectivity for the first dielectric layer and the second dielectric layer to provide for a vertical side wall 704 for the dielectric mask structure. The photoresist masking structure is removed to form the dielectric mask structure 702 as shown in FIG. 8. As shown, the dielectric mask structure includes the alternating layers of silicon oxide and silicon nitride in a specific embodiment. Of course there can be other variations, modifications, and alternatives.

Figure 9:
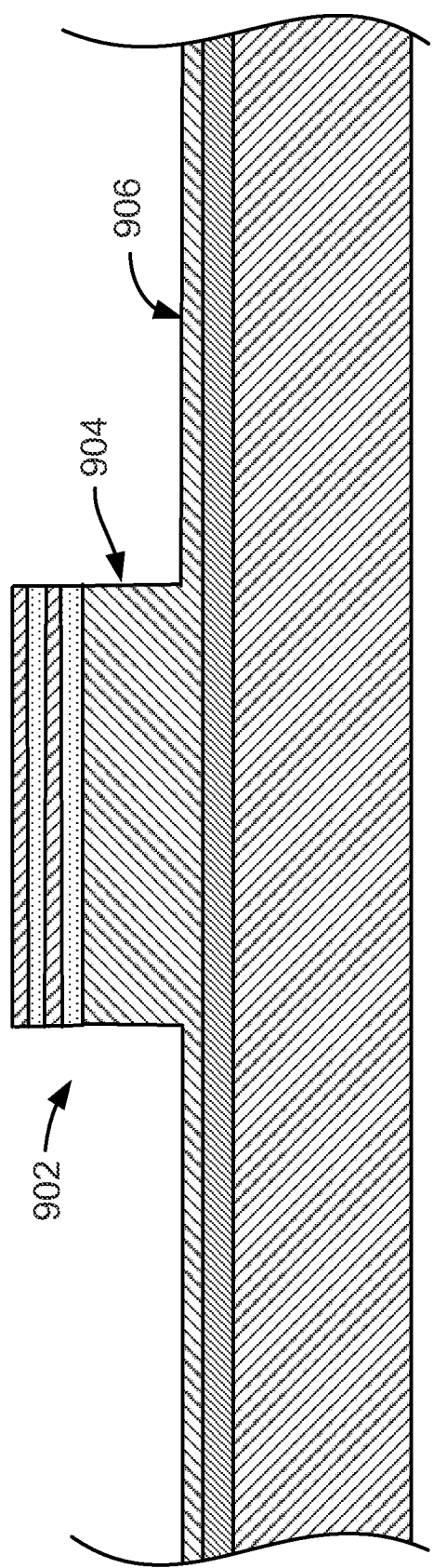

In a specific embodiment, the method performs a first selective etching process using the dielectric mask structure as an etch mask as shown in FIG. 9. The first selective etching process removes a portion of the upper clad layer to form a laser diode structure 902 while the dielectric mask structure remains substantially intact. Depending on the embodiment the laser diode structure may have different geometrical configurations such as stripes, islands, and others. The first selective etching process can be a plasma etch process or a wet etch process depending on the application. As shown, the laser diode structure has an exposed side region 904 and a first exposed region 906 in a specific embodiment. Of course one skilled in the art would recognize other variations, modifications, and alternatives.

Figure 10:
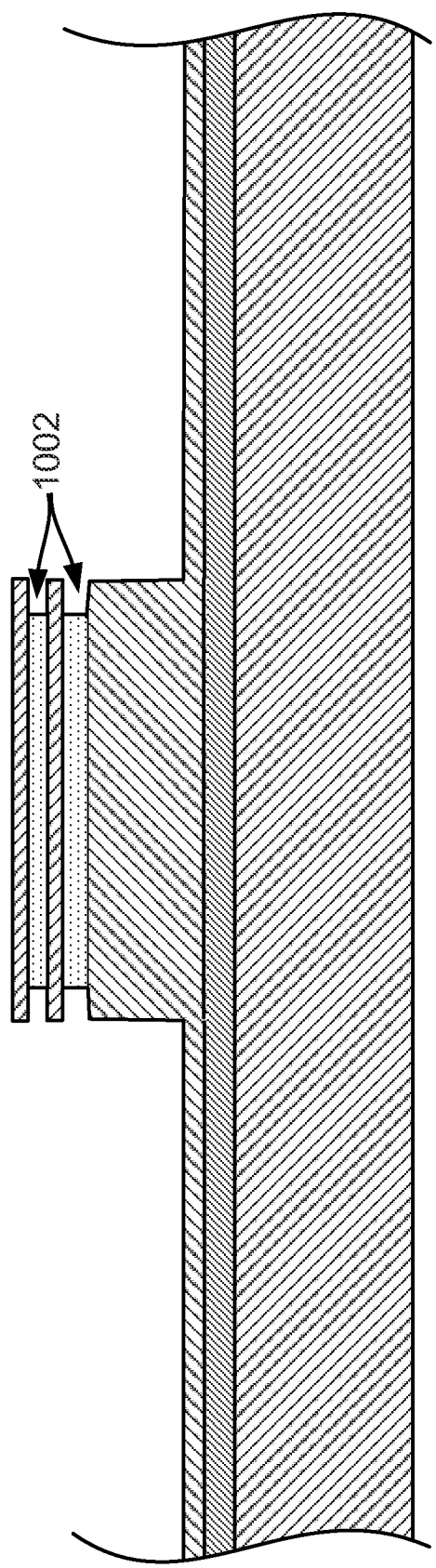

Referring to FIG. 10, the method subjects the dielectric mask structure to a second selective etch process to remove a portion of the first dielectric layer to form an undercut region 1002 between second dielectric layers. As merely an example, for silicon oxide as the first dielectric layer and silicon nitride as the second dielectric layer, the second selective etch process can use a wet etch process or an acid dip process using buffered hydrofluoric (BHF) acid. In this example, a portion of each silicon oxide layer is removed and the undercut region is formed between the silicon nitride layers. Other suitable etchants or process may also be used depending on the embodiment.

Alternatively, a portion of the silicon nitride may be selectively removed to form the undercut region between silicon oxide layers depending on the embodiment. The silicon nitride may be selectively removed using a phosphoric acid in a specific embodiment. Of course there can be other variations, modifications, and alternatives.

Figure 11:
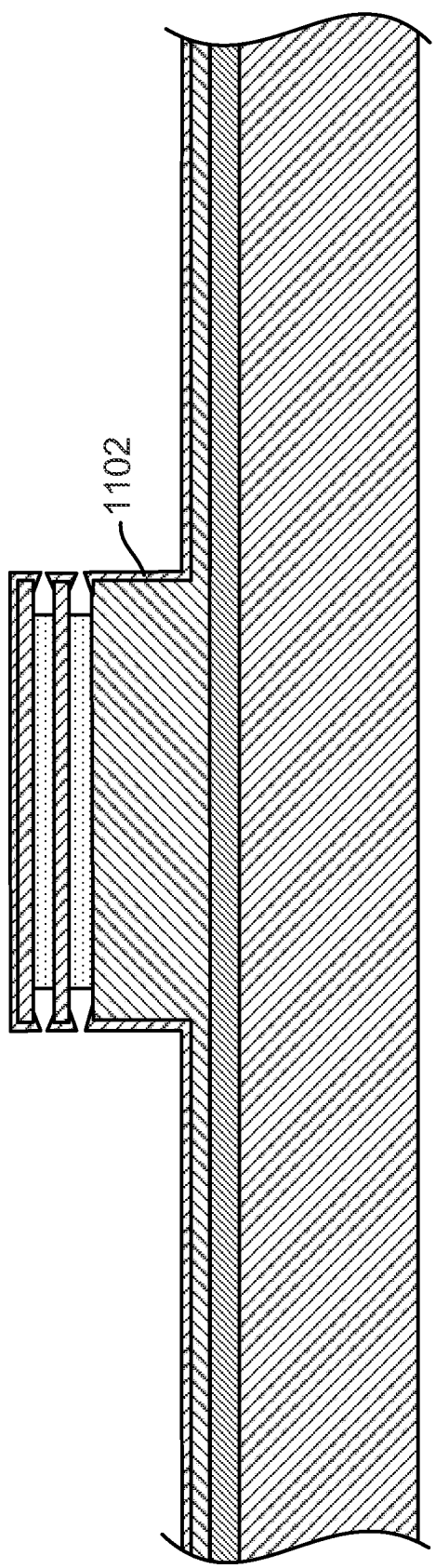

Referring to FIG. 11. In a specific embodiment, the method deposits a passivation layer 1102 overlying the dielectric mask structure, the exposed side region of the laser diode structure, and the first exposed region of the upper clad layer while the undercut region remained intact and substantially unfilled. The passivation layer can be deposited using a directional deposition process such as an electron beam deposition and using material such as zirconium oxide, tantalum oxide, amorphous silicon and the like in a preferred embodiment. Of course there can be other variations, modifications, and alternatives.

Figure 12:
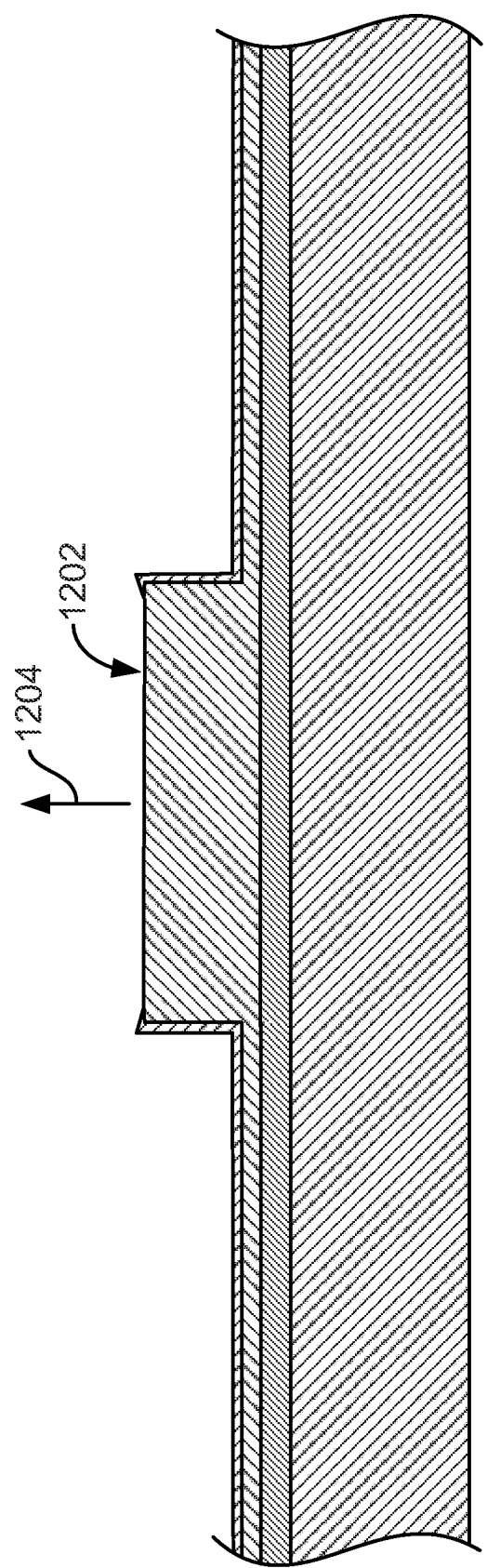

In a specific embodiment, the method includes selectively removing the dielectric mask structure to expose a top region 1202 of the laser diode structure as illustrated in FIG. 12. As shown, the passivation layer remained intact. A wet etch process selectively etches the dielectric mask is used. For example, for a silicon oxide/silicon nitride stack and a zirconium oxide passivation layer, the wet etch process can use etchant such as buffered HF and the like. Effectively, the undercut region in the dielectric stack allows for the etching process to occur in a lateral direction 1204 to thereby lift off the dielectric stack with no residue remain on the top region of the laser diode structure. As shown, the passivation layer remained on the side region of the laser diode structure and the first exposed region of the upper clad layer.

Figure 13:
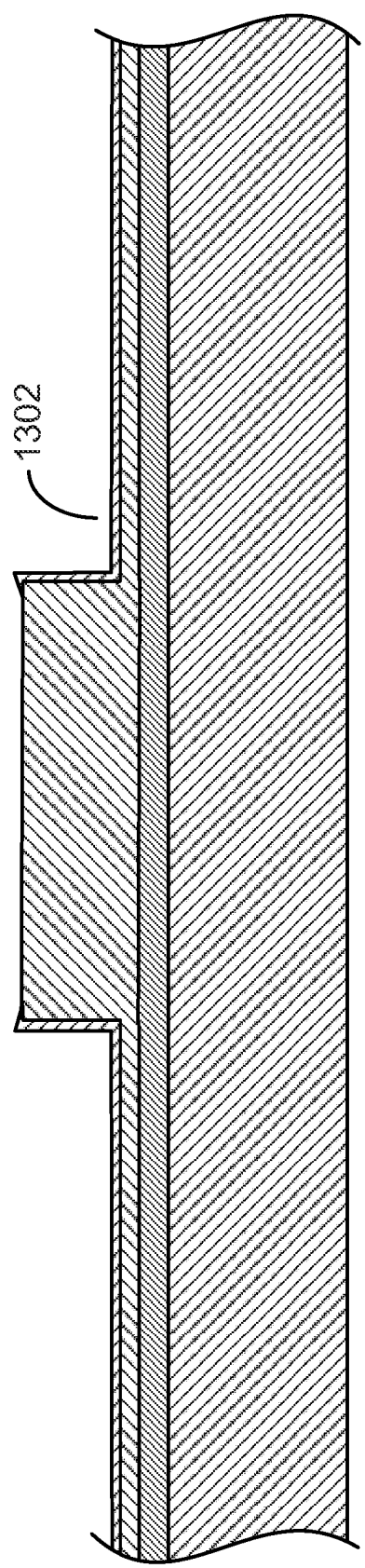

As shown in FIG. 13, a conductive layer 1302 is deposited overlying the exposed top region of the laser diode structure to form a contact element for the laser diode structure. Depending on the embodiment, the contact element can have a p-type contact, but other suitable contact elements may also be used. These other suitable contact elements may include a metal contact, and others.

While the above is a full description of the specific embodiments, various modifications, alternative constructions and equivalents may be used. Therefore, the above description and illustrations should not be taken as limiting the scope of the present invention which is defined by the appended claims

What is claimed is:

1. A method for forming a laser diode, comprising:
   providing a laser diode structure, comprising an under clad layer, an upper clad layer and an active layer sandwiched between the under clad layer and the upper clad layer;
   depositing a multilayer dielectric stack overlying the upper clad layer, the multilayer dielectric stack comprising alternating layers of at least a first dielectric layer and at least a second dielectric layer, wherein the at least first dielectric layer and the at least second dielectric layer are characterized by opposite strain polarities;
   selectively removing a portion of the multilayer dielectric stack to form a dielectric mask structure using a pattern and etching process;
   removing a portion of the upper clad layer using the dielectric mask structure as a mask to form the laser diode structure, the laser diode structure having an exposed sidewall region and a first exposed region, wherein the portion of the upper clad layer is removed while maintaining the dielectric mask structure substantially intact;
   selectively removing a portion of the at least first dielectric layer relative to the at least second dielectric layer to form an undercut region;
   depositing at least one passivation layer overlying the first exposed region, the exposed sidewall region, and the dielectric mask structure while maintaining the undercut region;
   removing the dielectric mask structure using a selective etch process to expose a top region of the laser diode structure, the undercut region allowing the selective etch process to occur in a lateral direction; and
   forming a contact structure overlying at least the top region of the laser diode structure.

2. The method of claim 1 wherein the upper clad layer comprises a first gallium nitride material.

3. The method of claim 1 wherein the active layer comprises a doped gallium nitride material (InGaN, AlGaN).

4. The method of claim 1 wherein the under clad layer comprises a second gallium nitride material.

5. The method of claim 1 wherein the first dielectric layer overlies the upper clad layer.

6. The method of claim 1 wherein the upper clad layer, the active layer, and the under clad layer are each formed using MOCVD or a molecular beam epitaxial method.

7. The method of claim 1 wherein the at least first dielectric layer includes a silicon oxide material.

8. The method of claim 1 wherein the at least second dielectric layer includes a silicon nitride material.

9. The method of claim 1 wherein selectively removing a portion of the at least first dielectric layer comprises a wet etch process.

10. The method of claim 7 wherein the step of selectively removing the portion of the at least first dielectric layer to form the undercut region comprises a wet etch process that uses at least a buffered HF as an etchant.

11. The method of claim 1 wherein the pattern and etching process includes a patterning step and a dry etch step.

12. The method of claim 1 wherein the undercut region is a void region.

13. The method of claim 1 wherein the at least one passivation layer is selected from $ZrO_2$, $Ta_2O_5$, amorphous silicon or a combination thereof and conformally covers the first exposed region.

14. The method of claim 1 wherein the contact structure has a p-type characteristics.

15. The method of claim 1 wherein the contact structure comprises a metal.

16. A method for forming a laser diode, comprising:
   providing a laser diode structure comprising an upper layer;
   depositing a multilayer dielectric stack overlying the upper layer, the multilayer dielectric stack comprising alternating layers of at least one first dielectric layer and at least one second dielectric layer, wherein the at least one first dielectric layer and the at least one second dielectric layer are characterized by opposite strain polarities;
   selectively removing a portion of the multilayer dielectric stack to form a dielectric mask structure using a pattern and etching process;
   removing a portion of the upper layer using the dielectric mask structure as a mask to form the laser diode structure, the laser diode structure having an exposed sidewall region and a first exposed region, wherein the portion of the upper layer is removed while maintaining the dielectric mask structure substantially intact;
   selectively removing a portion of each of the at least one first dielectric layer to form an undercut region between each of the at least one second dielectric layer;
   depositing at least one passivation layer overlying the first exposed region, the exposed sidewall region, and the dielectric mask structure while maintaining the undercut region;
   removing the dielectric mask structure using a selective etch process, wherein the selective etch process occurs in a lateral direction within the undercut region; and
   exposing a top region of the laser diode structure.

* * * * *